United States Patent
Mae

(10) Patent No.: US 7,059,870 B2
(45) Date of Patent: Jun. 13, 2006

(54) IC SOCKET

(75) Inventor: Katsunori Mae, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/180,766

(22) Filed: Jul. 12, 2005

(65) Prior Publication Data

US 2006/0014401 A1     Jan. 19, 2006

(30) Foreign Application Priority Data

Jul. 14, 2004   (JP) .............................. 2004-206788

(51) Int. Cl.
*H01R 12/00* (2006.01)
(52) U.S. Cl. .......................... 439/71; 439/331; 324/755
(58) Field of Classification Search ................. 439/71, 439/331; 324/755
See application file for complete search history.

(56) References Cited

U.S. PATENT DOCUMENTS

| | | | | |
|---|---|---|---|---|
| 4,931,020 A | * | 6/1990 | Matsuoka et al. | 439/72 |
| 5,573,418 A | * | 11/1996 | Matsuoka | 439/331 |
| 6,220,870 B1 | * | 4/2001 | Barabi et al. | 439/71 |

FOREIGN PATENT DOCUMENTS

| | | |
|---|---|---|
| JP | 5-249182 | 9/1993 |
| JP | 9-211067 | 8/1997 |
| JP | 2000-260910 | 9/2000 |
| JP | 2002-164136 | * 6/2002 |

* cited by examiner

*Primary Examiner*—Truc Nguyen
(74) *Attorney, Agent, or Firm*—Cooper & Dunham LLP

(57) ABSTRACT

An IC socket includes a package guide member including a package receiving part configured to arrange a semiconductor device where a plurality of external connection terminals are arranged in a single plane surface at a designated position, a contact terminal having a tip arranged so as to correspond to a position of the corresponding external connection terminal when the semiconductor device is received in the package receiving part where the external connection terminals are situated at a lower side, a contact terminal supporting member situated separately from the package guide member, the contact terminal supporting member being configured to support the contact terminal, a wiring member configured to electrically connect to the contact terminal, a position adjustment mechanism configured to adjust and fix the position of the contact terminal supporting member to the package guide member, and a wiring unit having an electrode as corresponding to the wiring member, the wiring unit being fixed to a testing wiring substrate.

9 Claims, 6 Drawing Sheets

IC SOCKET

BACKGROUND OF THE INVENTION

1. Field of the Invention

The present invention relates to an IC socket for electrically connecting a semiconductor device and a testing device for an electrical characteristic test of the semiconductor device. The IC socket of the present invention is, for example, used for the electrical characteristic test of the semiconductor device where plural external connection terminals are arranged in a single plane surface, such as BGA (Ball Grid Array) or CSP (Chip Size Package). More specifically, the IC chip of the present invention is useful for, for example, a wafer level CSP having an arrangement of fine external connection terminal.

2. Description of the Related Art

In a case where an electrical characteristic test of a semiconductor device where plural external connection terminals are arranged in a single plane surface, such as BGA (Ball Grid Array) or CSP (Chip Size Package), is implemented, an IC socket is generally used for electrically connecting the external connection terminal of the semiconductor device and an electrode of a testing device. A contact terminal is arranged at a position corresponding to the external connection terminal in the IC socket.

When the electrical characteristic test of the semiconductor device is implemented, the IC socket is mounted on a wiring substrate for testing such as a DUT (Device Under Test) board. The contact terminal is electrically connected to the testing device via the DUT board. A testing signal is supplied from the testing device to the semiconductor device via the DUT board and the contact terminal in a state where the semiconductor device is arranged at a designated position of the IC socket so that the external connection terminal of the semiconductor device and the contact terminal of the IC socket contact each other.

In order to accurately implement the electrical characteristic test of the semiconductor device, it is necessary to make the external connection terminal of the semiconductor device and the contact terminal of the IC socket accurately contact each other.

As a related art IC socket having a function for accurately contacting the external connection terminal and the contact terminal each other, a structure where a socket main body, a socket cover, and a substrate which is received in the socket main body and on which a semiconductor element (semiconductor device) is mounted, for example, are provided, is applied. See Japan Laid-Open Patent Application Publication No. 9-211067, for example. In this case, the socket main body includes a socket pin as the contact terminal. The socket pin is exposed to an internal bottom surface of the socket main body and pulled out to an outside of the socket main body via a bottom surface of the socket main body. The substrate includes a wiring layer electrically connecting the socket pin and an electrode of the semiconductor element, namely an external connection terminal. The substrate includes a wall part formed in a body so that the wall part comes in contact with two side of the semiconductor element. The socket body may include pressing means configured to contact two sides of the semiconductor element facing two sides of the socket main body for pressing.

In addition, another related art IC socket having the following structure is disclosed in Japan Laid-Open Patent Application Publication No. 5-249182, for example. In this IC socket, a plurality of probes (contact terminals) the front end sections of which are inserted into pinholes of a stylus guide plate for specifying the tip position of the probes (contact terminals) as contact electrodes and which are composed of thin wires having fixed intermediate sections and spring properties are fitted to positions corresponding to the electrodes (external connection terminals) of a semiconductor chip (semiconductor device) and the electrodes of the semiconductor chip are positioned at the tips of the probes by means of a chip guide. After positioning the electrodes, the semiconductor chip is pressed against the probes by means of a chip keeper. Since the front ends of the probes (contact terminals) having the spring properties protrude from the pinholes of the stylus guide plate and are accurately brought into contact with the electrodes of the semiconductor chip, the probes can be brought into electric contact with the semiconductor chip with high reliability.

In addition, an example of the wafer level CSP is disclosed. See Japan Laid-Open Patent Application Publication No. 2000-260190, for example. The wafer level CSP is a CSP wherein the external connection terminal is formed prior to application of a dicing process of the chip. For example, the wafer level CSP has an outside dimension of approximately 1 mm and a thickness of approximately 0.4 mm. The diameter of the external connection terminal is approximately 0.2 mm.

However, in a case where the external connection terminal having the pin-shaped configuration is used as disclosed in Japan Laid-Open Patent Application Publication No. 5-249182, the tip position of the external connection terminal is adjusted in the step for assembling the IC socket. The IC socket wherein adjusting the tip position of the contact terminal is completed is fixed to the DUT board and used for the electrical characteristic test of the semiconductor device.

A gap in the tip position of the contact terminal may be generated due to the use of the IC socket mounted on the DUT board. In this case, it is necessary to readjust the tip position of the contact terminal. However, there are processes for adjustment of the tip position of the contact terminal, such as removal of the IC socket from the DUT board, disassembly of the IC socket, adjustment of the tip position of the contact terminal, assembly of the IC socket, and mounting the IC socket on the DUT board. Hence, a large number of process and a large amount of time are necessary for the adjustment of the tip position of the contact terminal.

SUMMARY OF THE INVENTION

Accordingly, it is a general object of the present invention to provide a novel and useful IC socket.

Another and more specific object of the present invention is to provide an IC socket whereby the tip position of the contact terminal can be easily adjusted.

The above object of the present invention is to provide an IC socket, including:

a package guide member including a package receiving part configured to arrange a semiconductor device where a plurality of external connection terminals are arranged in a single plane surface at a designated position;

a contact terminal having a tip arranged so as to correspond to a position of the corresponding external connection terminal when the semiconductor device is received in the package receiving part where the external connection terminals are situated at a lower side;

a contact terminal supporting member situated separately from the package guide member, the contact terminal supporting member being configured to support the contact terminal;

a wiring member configured to electrically connect to the contact terminal;

a position adjustment mechanism configured to adjust and fix the position of the contact terminal supporting member to the package guide member; and a wiring unit having an electrode as corresponding to the wiring member, the wiring unit being fixed to a testing wiring substrate;

wherein the package guide member, the contact terminal, the contact terminal supporting member, the wiring member, and the position adjustment mechanism form a probe unit;

the probe unit and the wiring unit are detachably provided; and the position adjustment mechanism adjusts and fixes a position of the contact terminal without disassembling the probe unit.

According to the above-mentioned invention, the IC socket includes the probe unit including the package guide member having the package receiving part, the contact terminal, the contact terminal supporting member, the wiring member, and the position adjustment mechanism; and the wiring unit having the electrode as corresponding to the wiring member and fixed to the testing wiring substrate. The probe unit and the wiring unit are detachably provided. Hence, while the wiring unit is fixed to the testing wiring substrate, the probe unit can be easily removed. In addition, the position of the contact terminal supporting member is adjusted and fixed to the removed probe unit by using the position adjustment mechanism without disassembling the probe unit. Therefore, it is possible to easily adjust the position of the tip of the contact terminal.

Furthermore, in the IC socket for testing the semiconductor device having a fine external connection terminal such as a wafer level CSP, in order to do fine adjustment of the tip position of the contact terminal, it is necessary to adjust it while checking with a microscope having a measuring function. Furthermore, since only the probe unit can be arranged in a microscope in a state where the wiring unit is removed, as compared with an IC socket including the wiring unit, it is possible to make a measurement of the IC socket arranged in the microscope, a height measurement for example, small.

In addition, in the conventional art, in a case where the semiconductor device which is an object of the electrical characteristic test has a concave-shaped external connection terminal having a substantially hemispheric configuration, if the tip of the external contact terminal comes in contact with the head end of the external connection terminal, the head end may be damaged so that a bad mounting of the semiconductor device after the test may happen.

Because of this, the external connection terminals of the semiconductor device received in the package receiving part may have a concave shape with a substantially hemispheric configuration; and the tip of the contact terminal may be arranged so as to correspond to a position on a side surface of the corresponding external connection terminal when the semiconductor device is received in the package receiving part in the state where the external connection terminals are situated at the lower side.

According to the above-mentioned invention, since the tip of the contact terminal can come in contact with the side surface of the external connection terminal at the time of testing of the semiconductor device, it is possible to avoid the generation of damage to the head end of the external connection terminal due to the contact of the tip of the external contact terminal and the head end of the external connection terminal. Hence, it is possible to improve the reliability of the mounting of the semiconductor device after the test.

The position adjustment mechanism may include an adjustment screw configured to adjust a position of the contact terminal supporting member, and a fixing screw configured to fix the position of the contact terminal supporting member.

According to the above-mentioned invention, the position of the contact terminal supporting member is adjusted by the adjustment screw and then fixed by the fixing screw. Hence, it is possible to prevent the position of the contact terminal supporting member from moving after the position is adjusted, since it is not necessary to continue positioning the contact terminal supporting member by the adjustment screw after the position of the contact terminal supporting member is fixed by the fixing screw. Therefore, it is possible to relieve the pressure of the adjustment screw on the contact terminal supporting member.

The IC socket may further include an energizing member configured to energize the semiconductor device received in the package receiving part to a lower side by a weight of the energizing member.

According to the above-mentioned invention, by energizing the semiconductor device with the weight of the energizing member, it is possible to give a constant amount of the pressurizing force per a single area. Because of this, even if an object of the electrical characteristic test is a fine semiconductor device such as the wafer level CSP, for example, it is possible to prevent a problem such as damage to the external connection terminal of the semiconductor device, or a break or crack of the chip from being generated.

The IC socket may further include an energizing member supporting mechanism configured to cause the energizing member to gradually be lowered and to make contact with the semiconductor device after the energizing member is arranged at an upper position of the package receiving part where the energizing member does not come in contact with the semiconductor device.

According to the above-mentioned invention, it is possible to prevent the generation of immediate pressing on the semiconductor device. Hence, it is possible to prevent a problem such as damage to the external connection terminal of the semiconductor device, or a break or crack of the chip from being generated.

The energizing member supporting mechanism may include an energizing member supporting member arranging the energizing member at the upper position of the package receiving part so that the energizing member can be moved in a vertical or substantially vertical direction.

In order to prevent the generation of the shift of the pressing position on the semiconductor device by the energizing member, it is preferable that the energizing member supporting member support an end part side opposite to the slide member of the energizing member as the rotational shaft.

In a state where the slide member is arranged so that the energizing member is supported at the upper step part of the slide member, the energizing member is arranged at an upper position of the package receiving member by the energizing member supporting member. At this time, while the energizing member and the upper step part of the slide member come in contact each other, the energizing member does not come in contact with the semiconductor device. After that, by sliding the slide member to a side where the energizing member comes in contact with the tilt part of the slide member, the energizing member gradually falls along the tilt part of the slide member. The energizing member and the semiconductor device come in contact with each other so that the semiconductor device is gradually energized by the energizing member.

It is possible to prevent the generation of immediate pressing on the semiconductor device. Hence, it is possible to prevent a problem such as damage of the external connection terminal of the semiconductor device, a break or crack of the chip from being generated.

The energizing member may include a rotational member situated at a position corresponding to a slide member, the rotational member being configured to reduce a friction between the energizing member and the slide member.

According to the above-mentioned invention, it is possible to smoothly lower the energizing member along the tilt part of the slide member and reduce the friction between the energizing member and the slide member, and therefore to reduce the friction of the slider member.

The energizing member supporting member may be arranged in a cover member configured to cover the package guide member.

According to the above-mentioned invention, it is possible to exclude the energizing member supporting member and the energizing member from a working area at the time when the semiconductor device is in the package receiving part. Hence, it is possible to improve working efficiency when the semiconductor device is received in the package receiving part.

The IC socket may further include a cover fixing member configured to fix the cover member where the cover member covers the package guide member, wherein the cover fixing member and the slide member may be arranged in a body;

the cover fixing member may open the cover member in a state where an upper part of the slide member comes in contact with the energizing member; and the cover fixing member may slide so as to fix the cover member in a state where the semiconductor device received in the package receiving part comes in contact with the energizing member.

According to the above-mentioned invention, it is possible to avoid a problem of damage to the semiconductor device or the energizing member due to temporary adding of a changing pressure such as an external force to the energizing member when the semiconductor device is energized by the energizing member.

Other objects, features, and advantages of the present invention will become more apparent from the following detailed description when read in conjunction with the accompanying drawings.

DETAILED DESCRIPTION OF THE PREFERED EMBODIMENTS

A description of the present invention and details of drawbacks of the related art are now given, with reference to FIG. 1 through FIG. 12, including embodiments of the present invention.

Figure 1:
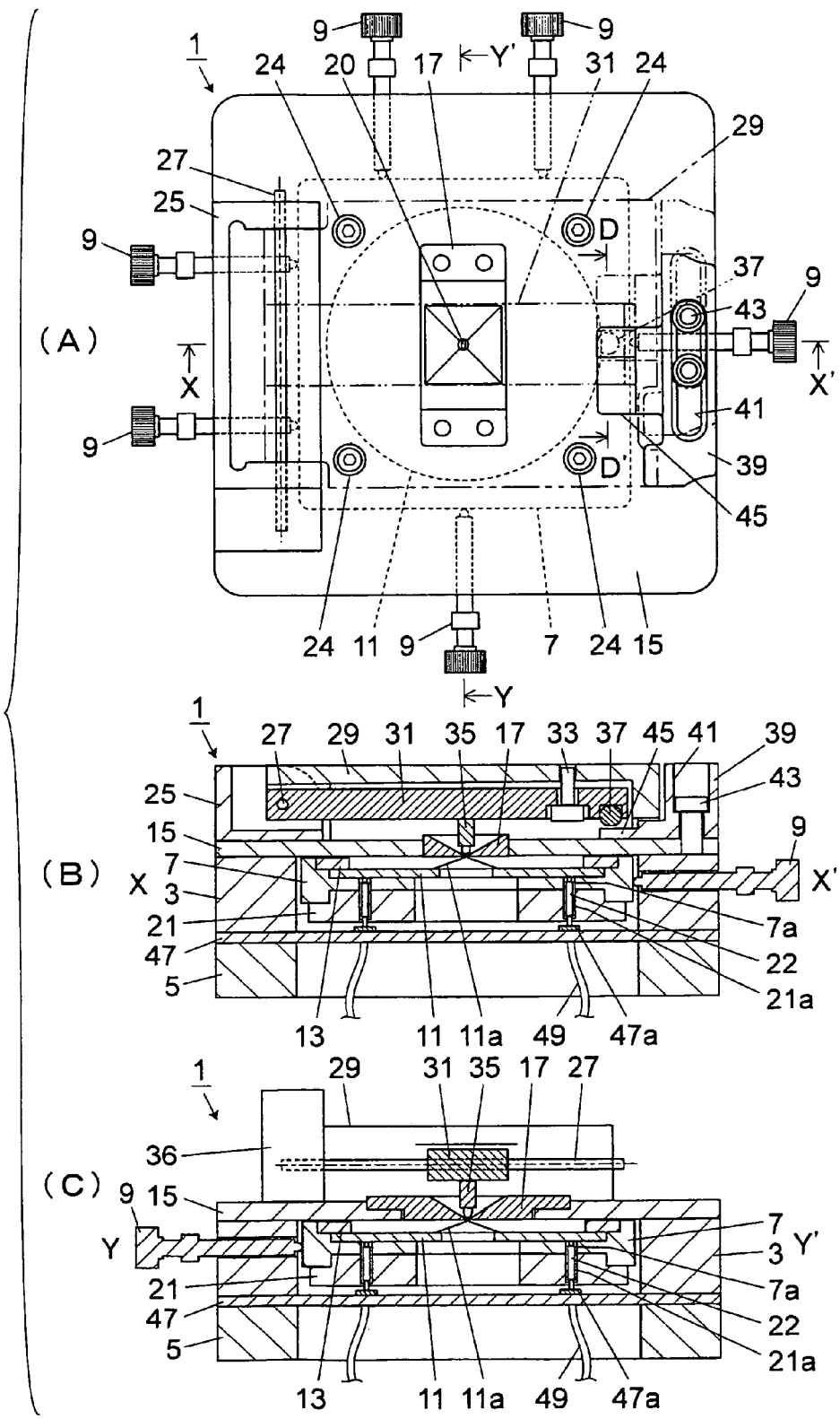
FIG. 1-(A) is a plan view showing an example of an IC socket of the present invention, FIG. 1-(B) is a cross-sectional view taken along the line X–X' of FIG. 1-(A), and FIG. 1-(C) is a cross-sectional view taken along the line Y–Y' of FIG. 1-(A)

FIG. 1-(A) is a plan view showing an example of an IC socket of the present invention, FIG. 1-(B) is a cross-sectional view taken along the line X–X' of FIG. 1-(A), and FIG. 1-(C) is a cross-sectional view taken along the line Y–Y' of FIG. 1-(A). An IC socket 1 includes a probe unit base 3 having a substantially rectangular parallelepiped-shaped configuration and a wiring unit base 5. A space is formed in the probe unit base 3 so as to pierce from an upper surface to a lower surface. A contact unit supporting part 7 is arranged in the space. The contact unit supporting part 7 is separated from the probe unit base 3 in horizontal surface directions so that position adjustment can be implemented.

Multiple adjustment screws 9 are provided on the side surfaces of the probe base unit 3. By the adjustment screws 9, fine rotational (tilt) and translational adjustment of position in the horizontal surface direction of the contact unit supporting part 7 is implemented by two sets of three contact points of corresponding adjustment screws 9, each set supporting a different pair of side surfaces of the contact unit support part 7 facing each other.

A contact unit 11 is arranged on an upper surface side of the contact unit supporting part 7. A cover 13 is provided on an upper surface of the contact unit supporting part 7. The cover 13 covers a peripheral part of the contact unit 11 so that the contact unit 11 is fixed to the contact unit supporting part 7.

A cover chassis 15 is provided on the upper surface of the probe unit base 3 so as to cover the contact unit supporting part 7, the contact unit 11 and the cover 13. An opening part is formed in the center of the cover chassis 15. A positioning guide (package guide member) 17 is arranged in the opening part.

Figure 2:
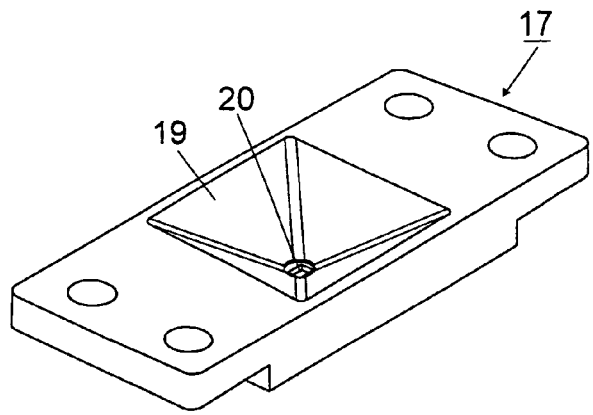
FIG. 2 is a perspective view showing an example of a positioning guide.

FIG. 2 is a perspective view showing an example of the positioning guide 17. Referring to FIG. 2, a concave part 19 is formed in the positioning guide 17. A package receiving part 20 is formed on the bottom part of the concave part 19. The package receiving part 20 is formed by a concave part having a plane-shaped configuration slightly larger than an outside dimension of the wafer level CSP which is an object for measurement.

Curved convex parts are formed at four corners of the package receiving part 20. Piercing holes 20a are formed in the bottom part of the package receiving part 20 as corresponding to the arrangement of the external connection terminals of the wafer level CSP which is an object of the measurement.

In this example, four piercing holes 20a are formed in the package receiving part 20. The package receiving part 20 excluding the curve convex parts has a length of 1.00 mm, a thickness of 1.00 mm, and a depth of 0.60 mm. The thickness of the bottom part is 0.20 mm. Each piercing hole 20a has a diameter of 0.35 mm. The piercing holes 20a are arranged vertically and horizontally at a pitch of 0.50 mm.

Zirconia group ceramic, for example, can be used as a material for the positioning guide 17. The configuration, material, measurement and function of the package guide member of the present invention is not limited to the positioning guide 17.

Figure 3:
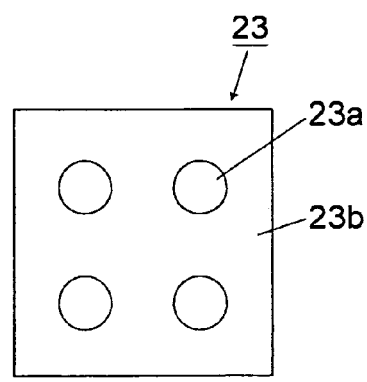
FIG. 3 is a bottom view of an example of a wafer level CSP which is an object of measurement.

FIG. 3 is a bottom view of an example of a wafer level CSP which is an object of measurement. The wafer level CSP 23 is a CSP wherein the external connection terminal 23a is formed prior to a dicing process of the chip. For example, the wafer level CSP 23 has an outside dimension of 0.82×0.82 mm and a thickness of approximately 0.4 mm. Four external connection terminals 23a are arranged vertically and horizontally in the bottom surface 23b of the wafer level CSP. The diameter of the external connection terminal 23a is approximately 0.18 mm. The height of the external connection terminal 23a is approximately 0.08 mm. The external connection terminals 23a are arranged vertically and horizontally at a pitch of 0.50 mm.

Figure 4:
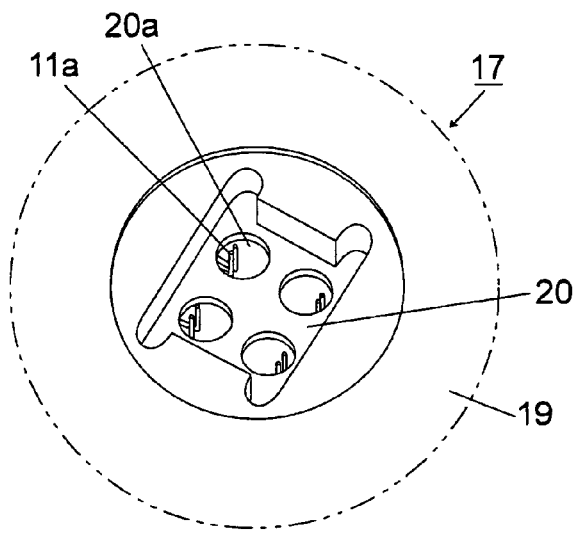
FIG. 4 is an enlarged perspective view showing a package receiving part.

FIG. 4 is an enlarged perspective view showing a package receiving part. The package receiving part 20 makes a position in a horizontal surface direction and a position in a vertical direction of the wafer level CSP which is an object of the measurement.

Contact terminals 11a are provided in the contact unit. The contact terminals 11a are arranged at a lower part of the package receiving part 20 as corresponding to arrangements of the piercing hole 20a and the external connection terminal 23a of the wafer level CSP 23. The tip of the contact terminal 11a is arranged in the piercing hole 20a. The tip has a diameter of 0.025 mm. The tip of the contact terminal 11a is arranged so as to correspond to a position of a side surface of the external connection terminal 23a when the wafer level CSP 23 is received in the package receiving part 20 in a state where the external connection terminal 23a is situated at a lower side.

Figure 5:
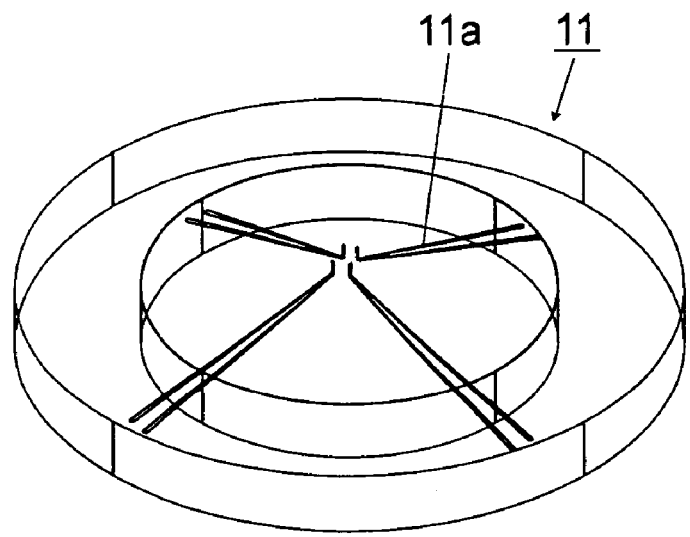
FIG. 5 is a schematic perspective view showing a contact unit.

FIG. 5 is a schematic perspective view showing the contact unit 11. In the contact unit 11, two contact terminals are provided for a single external connection terminal 23a so that contact resistance between the contact terminal 11a and the external connection terminal 23a in the electrical characteristic test of the semiconductor device is prevented. The base of the contact unit 11 is made of glass or glass epoxy, for example. A substrate (not shown) where a signal copper wire is arranged is mounted in the contact unit. In the contact unit 11, the electrical connection of the contact terminal 11a is led to a surface opposite to a surface supporting the contact terminal 11a of the contact unit 11, via the signal copper wire.

The contact unit supporting part 7 and the contact unit 11 form a contact terminal supporting member of the IC socket of the present invention.

Figure 6:
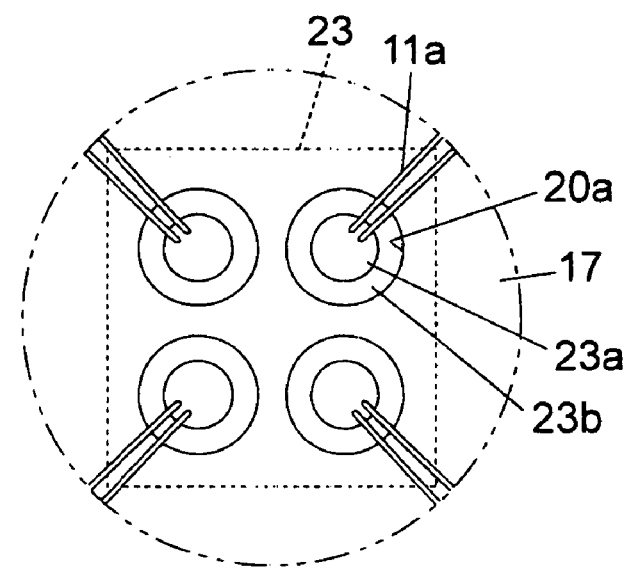
FIG. 6 is a plan view of a state where a contact terminal comes in contact with an external connection terminal of a wafer level CSP, seen from a lower side.

FIG. 6 is a plan view of a state where a contact terminal comes in contact with an external connection terminal of a wafer level CSP, seen from a lower side. Two contact terminals 11a as a couple come in contact with the external connection terminal 23a. Such a contact method is called Kelvin Contact and advantageous in that electric resistance at the contact terminal 11a is reduced.

Referring back to FIG. 1 showing the IC socket 1, a piercing hole 7a is formed in the contact unit supporting part 7 as corresponding to the signal wire formed on the contact unit 11. A pin base 21 is arranged at a side opposite to the contact unit 11 of the contact unit supporting part 7. A piercing hole 21a is formed in the pin base 21 so as to correspond to the piercing hole 7a. The pin base 21 is fixed to the contact unit supporting part 7.

A pogo pin 22 made of a conductive material is arranged in the piercing hole 7a of the contact unit supporting part 7 and the piercing hole 21a of the pin base 21 so as to not be dropped out. One end of the pogo pin 22 comes in contact with the signal copper wire of the contact unit 11 so that the pogo pin 22 is electrically connected to the contact terminal 11a via the signal copper wire. The signal copper wire of the contact unit 11 and the pogo pin 22 form a wiring member of the IC socket of the present invention.

Opening parts are formed in the cover chassis 15 as corresponding to four corners of the contact unit supporting part 7. Screw holes are respectively formed at the four corners of the contact unit supporting part 7 as corresponding to the opening part. Fixing screws 24 are screw fixed with the screw holes of the contact unit supporting part 7 via the opening part of the cover chassis 15 so that the cover chassis 15 is fixed to the contact unit supporting part 7. The opening parts of the cover chassis 15 are larger than the diameter of the screw part of the fixing screw 24 and smaller than the head part of the fixing screw 24. The contact unit supporting part 7 whose position is adjusted by the adjustment screw 9 can be fixed by the fixing screws 24 at the adjusted position. Because of this, it is possible to prevent the contact unit supporting part 7 from moving after the position of the contact unit supporting part 7 is adjusted by the adjustment screws 9. In addition, after the contact unit supporting part 7 is positioned by the fixing screws 24, it is not necessary to continue positioning the contact unit supporting part 7 by the adjustment screws 9. Hence, by removing or loosening the adjustment screws 9, it is possible to remove or ease the force of the adjustment screws 9 on the contact unit supporting part 7.

The adjustment screw 9 and the fixing screw 24 form a position adjustment mechanism of the IC socket of the present invention.

The probe unit base 3, the contact unit supporting part 7, the adjustment screw 9, the contact unit 11, the contact terminal 11a, the cover 13, the cover chassis 15, the positioning guide 17, the pin base 21, and the pogo pins 22 form the probe unit of the IC socket of the present invention.

A shaft supporting base 25 is fixed to an upper surface of the cover chassis 15. A shaft 27 is provided at the shaft supporting base 25 parallel to a horizontal surface.

Figure 7:
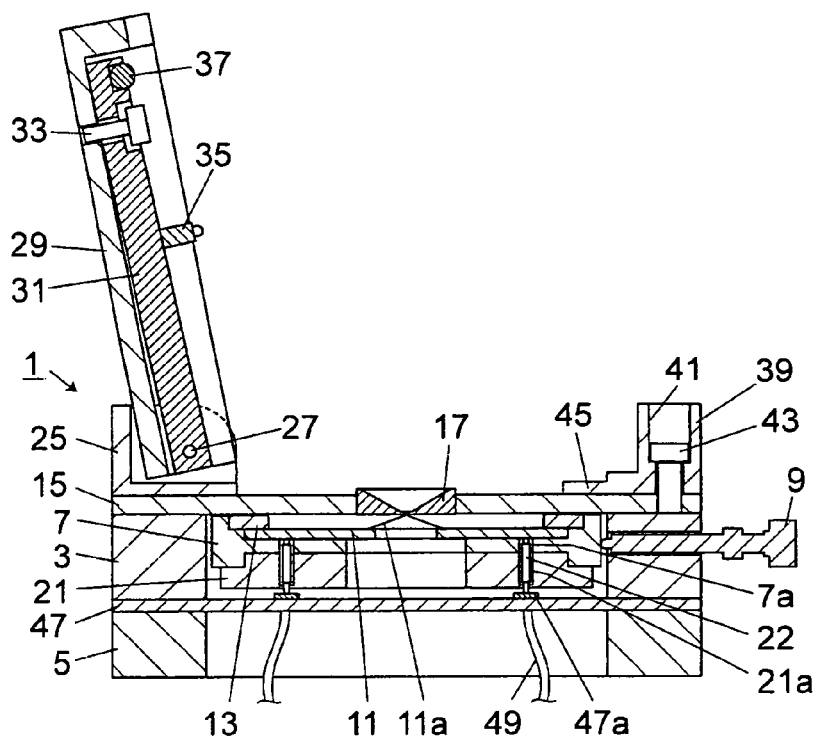
FIG. 7 is a cross-sectional view of the IC socket in a state where a cover is opened.

A cover (cover member) 29 and a weight 31 are provided so as to be Rotated with respect to the shaft 27. FIG. 1 shows a state where the cover 29 is closed while FIG. 7 shows a state where the cover 29 is opened.

The shaft 27 is used as a common rotational shaft for the cover 29 and the weight 31. The cover 29 and the weight 31 are not fixed to each other. The cover 29 and the weight 31 are provided so as to be independently rotated. The weight 31 is provided inside of the cover 29. A lowering length when the cover 29 is closed is limited by a lowering length adjustment screw 33 provided in the cover 29.

The cover 29 is fixed to the shaft 27. A hydraulic dumper 36 is provided at one end of the shaft 27 so that the opening and closing speed of the cover 29 and the shaft 27 is limited. The hydraulic dumper 36 prevents the wafer level CSP 23 from being taken out from the package receiving part 20 due to the cover 29 being immediately closed and the IC socket being vibrated. The mechanism for limiting the opening and closing speed of the cover 29 is not limited to the hydraulic dumper 36 and may be another mechanism.

In the weight 31, a pressing head 35 is provided at a position corresponding to the package receiving part 20. The pressing head 35 energizes (applies a force to) a surface opposite to a surface where the external connection terminals of the wafer level CSP, arranged in the package receiving part 20, are arranged, toward the lower side. A ball member made of resin is arranged at a head end of the pressing head 35. The ball member comes in contact with the wafer level CSP. An elastic body such as a coil spring is received in the pressing head 35. The coil spring contracts so that destruction of the wafer level CSP is prevented and the pressing force is adjusted so as to have a constant amount.

In the weight 31, a ball member 37 is arranged at a lower surface at an end part side opposite to the shaft 27. The weight 31, the pressing head 35 and the ball member 37 form an energizing member of the IC socket of the present invention.

A cover fixing member 39 is arranged on an upper surface of the cover chassis 15. The positioning guide 17 is put between the shaft supporting base 25 and the cover fixing member 39. In the cover fixing member 39, an elongated hole 41 is formed parallel to the shaft 27. A pin 43 fixed to the cover chassis 15 is arranged in the elongated hole 41. The cover fixing member 39 is slidably arranged parallel to the shaft 27 in horizontal surface directions by using the elongated hole 41 as a guide.

Figure 8:
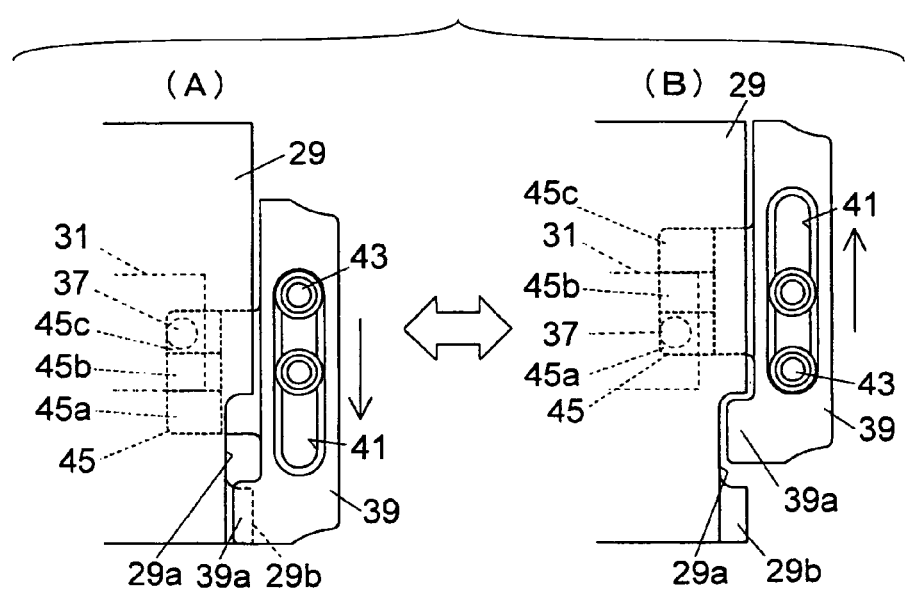
FIG. 8-(A) is a plan view showing the periphery of a cover fixing member in a state where the cover is fixed, and FIG. 8-(B) is a plan view showing the periphery of the cover fixing member in a state where the cover is not fixed.

FIG. 8-(A) is a plan view showing the periphery of the cover fixing member 39 in a state where the cover 29 is fixed and FIG. 8-(B) is a plan view showing the periphery of the cover fixing member in a state where the cover 29 is not fixed. IN FIG. 1-(A), a position illustrated with a solid line of the cover fixing member 39 shows a state where the cover 29 is fixed. A position illustrated with a two-dotted line of the cover fixing member 39 shows a state where the cover 29 is not fixed.

A projection part 39a is provided at the cover fixing member 39. A concave part 29a and a step part 29b are formed in the cover 29 as corresponding to the projection part 39a.

When the cover 29 is closed, as shown in FIG. 8-(B), the cover fixing member 39 is positioned so that the projection part 39a of the cover fixing member 39 corresponds to the concave part 29a of the cover 29 (Cover opening position).

After the cover 29 is closed, as shown in FIG. 8-(A), the cover fixing member 39 is slid so that the projection part 39a of the cover fixing member 39 is situated on the step part 29b of the cover 29 (Cover fixing position).

Thus, the cover 29 is fixed by the cover fixing member 39.

In a state where the cover fixing member 39 is positioned in the cover fixing position (See FIG. 8-(A)), when the cover 29 is opened, even if the cover 29 is tried to be closed, a part of the step part 29 of the cover 29 comes in contact with the projection part 39a of the cover fixing member 39 and therefore the cover 29 cannot closed. Under this structure, an excessive force is prevented from being applied in error to the wafer level CSP arranged in the package receiving part 20.

Figure 9:
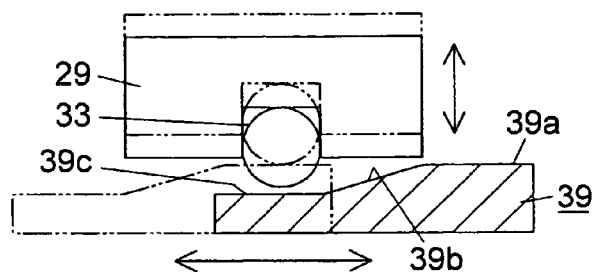
FIG. 9 is an enlarged cross-sectional view taken along the line D–D' of FIG. 1-(A)

FIG. 9 is an enlarged cross-sectional view taken along the line D–D' of FIG. 1-(A). As shown in FIG. 9, a ball contact base (slide member) 45 is provided at a position of the cover fixing member 39 corresponding to the ball member 37 of the weight 31. The ball contact base includes an upper step part 45a, a tilt part 45b inclining from the upper step part 45a to a lower side, and a lower step part 45c continuously situated at a position lower than the upper step part 45a in the tilt part 45b.

The shaft 27 and the lowering length adjustment screw 33 form an energizing member supporting member of the IC socket of the present invention. The above-mentioned energizing member supporting member and the ball contact base (slide member) 45 form an energizing member supporting mechanism of the IC socket of the present invention.

Next, the structure of the wiring unit is discussed. The wiring unit is formed by a wiring unit base 5 and a wiring substrate 47. A space piercing from the upper surface to lower surface is formed in the wiring unit base 5. The wiring substrate 47 is fixed to the upper surface of the wiring unit base 5. Electrodes 47a are formed on an upper surface of the wiring substrate 47 (a surface at a side of the probe unit) as corresponding to the pogo pins 22. An electrical potential of the electrode 47a is led to a rear surface of the wiring substrate 47, namely a surface opposite to the probe unit, and led to the outside of the IC socket by a lead wiring 49.

The probe unit and the wiring unit are positioned in a state where a pillar-shaped pin (not shown) projected from an upper surface of the wiring substrate 47 is fitted with a hole formed in the probe unit base 3. Hence, the probe unit and the wiring unit can be easily detached from each other.

Figure 10:
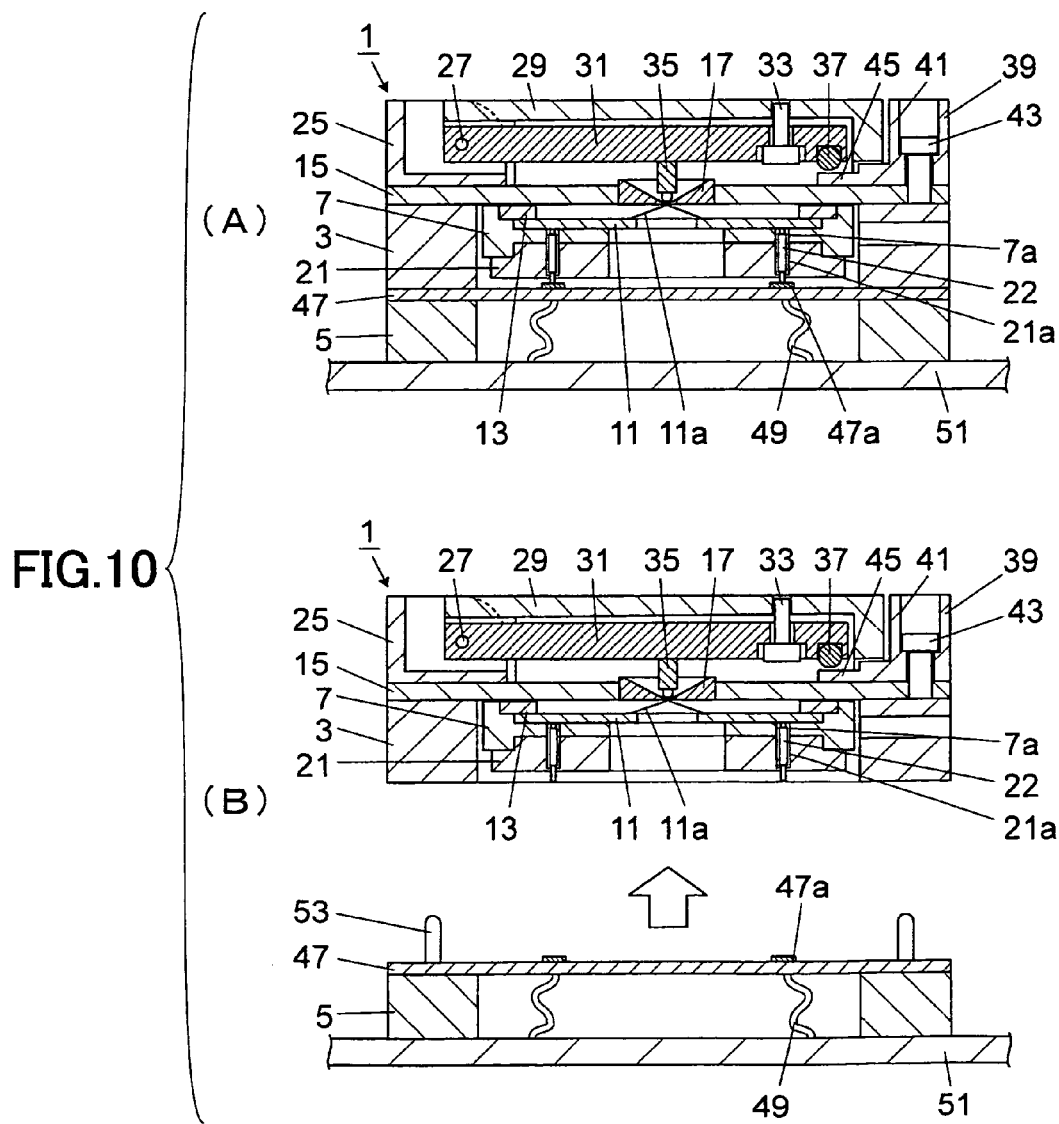
FIG. 10 is a cross-sectional view showing a case where the IC socket is mounted on a wiring substrate for testing, more specifically, FIG. 10-(A) is a cross-sectional view showing a state where a probe unit is mounted on a wiring unit and FIG. 10-(B) is cross-sectional view showing a state where the probe unit is removed from the wiring unit.

FIG. 10 is a cross-sectional view showing a case where the IC socket is mounted on a wiring substrate for testing. More specifically, FIG. 10-(A) is a cross-sectional view showing a state where a probe unit is mounted on a wiring unit and FIG. 10-(B) is cross-sectional view showing a state where the probe unit is separated from the wiring unit.

The wiring unit base 5 is fixed to the DUT board 51 by, for example, a screw (not shown). An end part of the lead wiring 49 situated at a side opposite to the end part at a side of the wiring substrate 47 is connected to an electrode (not shown) provided on the DUT board 51.

As shown in FIG. 10-(A), when the wiring unit is used, the probe unit is mounted on the wiring unit and the pogo pin 22 comes in contact with the electrode 47a of the wiring substrate 47. Under this structure, the contact terminal 11a and the electrode of the DUT board 51 are electrically connected via the lead wiring 49, the electrode 47a, the pogo pin 22, and the signal wiring provided in the probe unit 11. In this example, when the IC socket is used, the adjustment screws 9 (See FIG. 1) are removed.

When the position of the contact terminal 11a is adjusted or the contact terminal 11a is exchanged, as shown in FIG. 10-(B), the probe unit is removed from the wiring unit. The probe unit and the wiring unit are positioned in a state where pillar-shaped pin 53 projected from an upper surface of the wiring substrate 47 are fitted into corresponding holes formed in the probe unit base 3. Hence, the probe unit and the wiring unit can be easily detached from each other.

Next, an operation for adjusting the position of the tip of the contact terminal 11a against the removed probe unit is discussed with reference to FIG. 1. The adjustment screws 9 are fitted into the probe unit base 3 so that the contact unit supporting part 7 can be supported by the adjustment screws 9. After that, the fixing screws 24 are loosened. The probe unit is arranged for a microscope having a measuring function. By seeing via the microscope and rotating the adjustment screw 9, the contact unit supporting part 7 is moved and the tip of the contact terminal 11a is moved to a designated position. After the adjustment of the tip position of the contact terminal 11a is completed, the fixing screws 24 are tightened so that the position of the contact unit supporting part 7 is fixed. At this time, it is preferable to tighten the fixing screw 24 while determining whether a gap is generated at the tip position of the contact terminal 11a by using the microscope.

Thus, the position of the contact unit supporting part 7 is adjusted and fixed by using the adjustment screw 9 and the fixing screw 24 without disassembling the probe unit. Therefore, it is possible to easily adjust the position of the tip of the contact terminal 11a.

Furthermore, since only the probe unit can be arranged in the microscope in a state where the wiring unit is removed, as compared with an IC socket including a wiring unit, it is possible to make a measurement of the IC socket arranged in the microscope, a height measurement for example, small.

Next, an operation for receiving the wafer level CSP in the IC socket which is a measurement object is discussed.

As shown in FIG. 7, the cover 29 is opened and the wafer level CSP is received in the package receiving part 20. After that, the cover 29 is closed. As shown by two-dotted lines in FIG. 9 and FIG. 8-(B), in a state where the cover fixing member 39 is arranged at the cover opening position and the cover 29 is not fixed, the upper step part 45a of the ball contact base 45 is arranged at a position corresponding to the ball member 37 of the weight 31 so that the ball member 37 comes in contact with the upper step part 45a.

Figure 11:
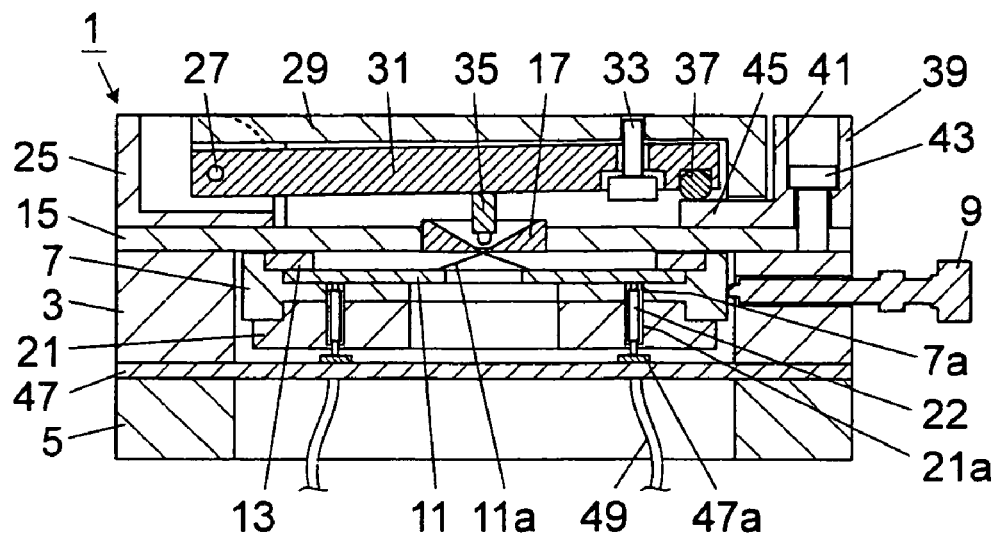
FIG. 11 is a cross-sectional view showing a state where the cover is closed and the cover fixing member does not fix the cover.

FIG. 11 is a cross-sectional view showing a state where the cover 29 is closed and the cover fixing member 39 does not fix the cover 29 at a position of the line X—X of FIG. 1-(A).

In this state, the ball member 37 of the weight 31 comes in contact with the upper step part 45a of the ball contact base 45 (See the two-dotted line of FIG. 9) and therefore the weight 31 is supported by the upper step part 45a and the shaft 27. At this time, a head end part of the pressing head 35 does not come in contact with the wafer level CSP received in the package receiving part 20.

If the cover fixing member 39 slides from the cover opening position shown in FIG. 8-(B) to the fixing position side shown in FIG. 8-(A), the ball member 37 of the weight 31 is rotated on the ball contact base 45 and comes in contact with first the upper step part 45a on the ball contact base 45 then the tilt part 45b in turn so that the position of the ball member 37 in a vertical direction is gradually lowered. Based on this, the weight 31 and the pressing head 35 gradually are lowered so that the pressing head 35 comes in contact with the wafer level CSP received in the package receiving part 20 and the wafer level CSP is gradually pressed to the lower side. The weight of the weight 31 is adjusted so as to be a proper amount. By gradually pressing with the weight of the weight 31, it is possible to prevent a problem, such as damage to the external connection terminal of the wafer level CSP, or a break or crack of the chip from being generated.

In a state where the cover fixing member 39 is fixed to the cover fixing position, the weight 31 is supported by the shaft 27, the lowering length adjustment screw 33, and the wafer level CSP so that the wafer level CSP is properly pressured by the pressing head 35. At this time, the amount of pushing-down of the wafer level CSP is limited by the bottom surface of the package receiving part 20. Under this structure, the external connection terminal of the wafer level CSP and the contact terminal 11a of the contact unit 11 are electrically connected in a good contact state.

After the electrical characteristic test for the wafer level CSP is conducted, when the wafer level CSP is taken out from the package receiving part 20, the cover fixing member 39 is slid from the cover fixing position shown in FIG. 8-(A) to the cover opening position side shown in FIG. 8-(B). Under this structure, the ball member 37 of the weight 31 comes in contact with first the tilt part 45b of the ball contact base 45 then the upper step part 45a. As the weight 31 is raised, the pressing head 35 is raised so that the wafer level CSP is released from the pressed state. After that, the cover 29 is opened, and the wafer level CSP is taken out from the package receiving part 20.

In the above-discussed embodiment for the positioning guide and the IC socket, the wafer level CSP shown in FIG. 5 is a measurement object. However, the semiconductor device that is a measurement object of the present invention is not limited to this. The present invention can be applied to various semiconductor devices by changing the side of the package receiving part and the arrangement of the contact terminal.

Furthermore, although the Kelvin contact wherein two contact terminals are provided for a single external connection terminal of the wafer level CSP is used in this embodiment, the present invention is not limited to this. A single or three and more contact terminal(s) may be provided for a single external connection terminal.

In addition, the tip of the contact terminal 11a comes in contact with the side surface of the external connection terminal 23a as shown in FIG. 6. The present invention is not limited to this. The contact terminal 11a may come in contact with any part of the external connection terminal 23a.

In this embodiment, the wiring member of the probe unit forming the IC socket of the present invention is formed by the signal wiring arranged in the probe unit and pogo pin 22. However, the wiring member is not limited to this. The wiring member may have any structure as long as the wiring member may detachably come in contact with the electrode provided in the wiring unit.

Figure 12:
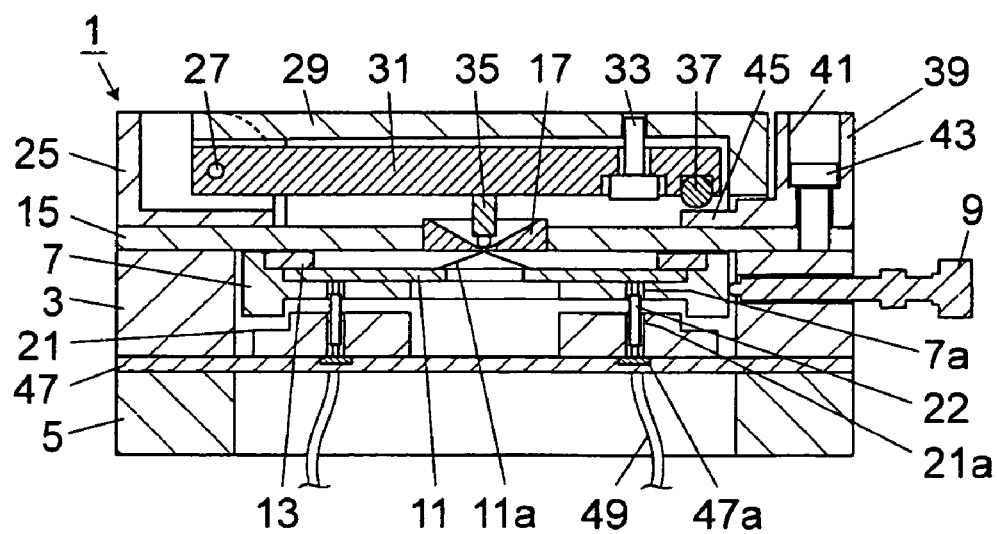
FIG. 12 is a view showing another example of the IC socket of the present invention.

For example, as shown in FIG. 12, the pin base 21 may be fixed to not the contact unit supporting part 7 but the wiring substrate 47. In this case, the pin base 21 and the pogo pin 22 form a part of the wiring unit of the IC socket of the present invention. The pogo pin 22 forms an electrode of the wiring unit.

In this embodiment, the adjustment screw 9 and the fixing screws 24 are provided as the position adjustment mechanism. The IC socket of the present invention is not limited to this. The position adjustment mechanism may have any structure such as a structure having only the adjustment screws 9, as long as the position of the contact unit supporting part 7 (contact terminal supporting member) can be adjusted and fixed without disassembling the probe unit.

In this embodiment, an elastic member is provided inside of the pressing head 35. The present invention is not limited to this structure. For example, any member such as a simple stick-shaped member can be used as long as the semiconductor device received in the package receiving part is pressed by the weight of the weight 31.

The present invention is not limited to the above-discussed embodiments, but variations and modifications may be made without departing from the scope of the present invention.

This patent application is based on Japanese Priority Patent Application No. 2004-206788 filed on Jul. 14, 2004, the entire contents of which are hereby incorporated by reference.

What is claimed is:

1. An IC socket, comprising:
   a package guide member including a package receiving part configured to arrange a semiconductor device where a plurality of external connection terminals are arranged in a single plane surface at a designated position;
   a contact terminal having a tip arranged so as to correspond to a position of the corresponding external connection terminal when the semiconductor device is received in the package receiving part where the external connection terminals are situated at a lower side;
   a contact terminal supporting member situated separately from the package guide member, the contact terminal supporting member being configured to support the contact terminal;
   a wiring member configured to electrically connect to the contact terminal;
   a position adjustment mechanism configured to adjust and fix the position of the contact terminal supporting member to the package guide member; and
   a wiring unit having an electrode as corresponding to the wiring member, the wiring unit being fixed to a testing wiring substrate;
   wherein the package guide member, the contact terminal, the contact terminal supporting member, the wiring member, and the position adjustment mechanism form a probe unit;
   the probe unit and the wiring unit are detachably provided; and
   the position adjustment mechanism adjusts and fixes a position of the contact terminal without disassembling the probe unit.

2. The IC socket as claimed in claim 1,
   wherein the external connection terminals of the semiconductor device received in the package receiving part have a concave shape with a substantially hemispheric configuration; and
   the tip of the contact terminal is arranged so as to correspond to a position on a side surface of the corresponding external connection terminal when the semiconductor device is received in the package receiving part in the state where the external connection terminals are situated at the lower side.

3. The IC socket as claimed in claim 1,
   wherein the position adjustment mechanism includes:
   an adjustment screw configured to adjust a position of the contact terminal supporting member; and
   a fixing screw configured to fix the position of the contact terminal supporting member.

4. The IC socket as claimed in claim 1, further comprising:
   an energizing member configured to energize the semiconductor device received in the package receiving part to a lower side by a weight of the energizing member.

5. The IC socket as claimed in claim 4, further comprising:
   an energizing member supporting mechanism configured to cause the energizing member to gradually be lowered and to make contact with the semiconductor device after the energizing member is arranged at an upper position of the package receiving part where the energizing member does not come in contact with the semiconductor device.

6. The IC socket as claimed in claim 5, wherein the energizing member supporting mechanism includes:
   an energizing member supporting member arranging the energizing member at the upper position of the package receiving part so that the energizing member can be moved in a vertical or substantially vertical direction.

7. The IC socket as claimed in claim 6,
   wherein the energizing member includes a rotational member situated at a position corresponding to a slide member, the rotational member being configured to reduce a friction between the energizing member and the slide member.

8. The IC socket as claimed in claim 6,
   wherein the energizing member supporting member is arranged in a cover member configured to cover the package guide member.

9. The IC socket as claimed in claim 8, further comprising:
   a cover fixing member configured to fix the cover member where the cover member covers the package guide member;
   wherein the cover fixing member and the slide member are arranged in a body;
   the cover fixing member opens the cover member in a state where an upper part of the slide member comes in contact with the energizing member; and
   the cover fixing member slides so as to fix the cover member in a state where the semiconductor device received in the package receiving part comes in contact with the energizing member.

* * * * *